(12) United States Patent
Ho et al.

(10) Patent No.: US 7,294,544 B1
(45) Date of Patent: Nov. 13, 2007

(54) METHOD OF MAKING A METAL-INSULATOR-METAL CAPACITOR IN THE CMOS PROCESS

(75) Inventors: Yen-Shih Ho, Chai-yi (TW);
Jau-Yuann Chung, Hsin-chu (TW);
Chun-Hon Chen, Hsin-chu (TW);
Hun-Jan Tao, Hsin-chu (TW)

(73) Assignee: Taiwan Semiconductor Manufacturing Co., ltd., Hsin-Chu (TW)

( * ) Notice: Subject to any disclaimer, the term of this patent is extended or adjusted under 35 U.S.C. 154(b) by 0 days.

(21) Appl. No.: 09/249,254

(22) Filed: Feb. 12, 1999

(51) Int. Cl.
*H01L 21/336* (2006.01)

(52) U.S. Cl. ............ 438/250; 438/387; 257/296; 257/E21.01

(58) Field of Classification Search ............ None
See application file for complete search history.

(56) References Cited

U.S. PATENT DOCUMENTS

| | | | | |
|---|---|---|---|---|
| 4,697,330 A | * | 10/1987 | Paterson et al. | 438/261 |
| 4,971,924 A | * | 11/1990 | Tigelaar et al. | 438/396 |
| 5,037,772 A | * | 8/1991 | McDonald | 438/396 |
| 5,338,701 A | * | 8/1994 | Hsu et al. | 438/210 |
| 5,406,447 A | * | 4/1995 | Miyazaki | 361/313 |
| 5,479,316 A | * | 12/1995 | Smrtic et al. | 361/322 |
| 5,554,558 A | * | 9/1996 | Hsu et al. | 438/253 |
| 5,576,240 A | * | 11/1996 | Radosevich et al. | 438/396 |
| 5,589,416 A | * | 12/1996 | Chittipeddi | 438/396 |
| 5,654,581 A | * | 8/1997 | Radosevich et al. | 257/534 |
| 5,708,559 A | * | 1/1998 | Brabazon et al. | 361/313 |
| 5,741,721 A | * | 4/1998 | Stevens | 438/396 |
| 6,285,050 B1 | * | 9/2001 | Emma et al. | 257/296 |

* cited by examiner

*Primary Examiner*—W. David Coleman
(74) *Attorney, Agent, or Firm*—Thomas, Kayden, Horstemeyer & Risley

(57) ABSTRACT

A method for fabricating an improved metal-insulator-metal capacitor is achieved. An insulating layer is provided overlying conducting lines on a semiconductor substrate. Via openings through the insulating layer to the conducting lines are filled with metal plugs. A first metal layer is deposited overlying the insulating layer and the metal plugs. A capacitor dielectric layer is deposited overlying the first metal layer wherein capacitor dielectric layer is deposited as a dual layer, each layer deposited within a separate chamber whereby pinholes are eliminated. A second metal layer and a barrier metal layer are deposited overlying the capacitor dielectric layer. The second metal layer and the barrier metal layer are patterned to form a top plate electrode. Thereafter, the capacitor dielectric layer and the first metal layer are patterned to form a bottom plate electrode completing fabrication of a metal-insulator-metal capacitor.

42 Claims, 4 Drawing Sheets

US 7,294,544 B1

METHOD OF MAKING A METAL-INSULATOR-METAL CAPACITOR IN THE CMOS PROCESS

BACKGROUND OF THE INVENTION (1) Field of the Invention

The present invention relates to a method of fabricating a metal-insulator-metal capacitor, and more particularly, to a method of forming an improved metal-insulator-metal capacitor in the fabrication of an integrated circuit device.

(2) Description of the Prior Art

Capacitors are critical components in the integrated circuit devices of today. Both polysilicon-insulator-polysilicon and metal-insulator-metal (MIM) capacitors have been used in the art. Polysilicon to polysilicon or polycide to polycide (PIP) capacitors perform at a high parasitic capacitance. Parasitic capacitance is calculated as the ratio of the $C_{capacitor}$ to $C_{substrate}$, where $C_{capacitor}$ is the capacitance between the capacitor plates and $C_{substrate}$ is the capacitance between the top plate or bottom plate of the capacitor to the silicon substrate. Generally, the parasitic capacitance for PIP capacitors is about 10%, but for MIM capacitors, the parasitic capacitance can be lower than 5%.

The process flow for making a polysilicon to polysilicon or polycide to polycide capacitor is not transparent to present or future CMOS technology. That is, the introduced thermal budget for making the PIP capacitor will affect the MOS devices with extra dopant diffusion effect. It is desirable that the capacitor process module be transparent to the present and future CMOS technology. Also, a high quality insulator must be provided within the capacitor.

U.S. Pat. Nos. 5,576,240 and 5,654,581 to Radosevich et al, 5,479,316 to Smrtic et al, 5,708,559 to Brabazon, 5,406,447 to Miyazaki, 5,741,721 to Stevens, and 4,971,924 to Tigelaar et al all disclose various methods of forming metal-insulator-metal capacitors. U.S. Pat. No. 5,589,416 to Chittipeddi teaches fabrication of a metal-oxide-polysilicon capacitor. U.S. Pat. Nos. 5,554,558 to Hsu et al, 5,338,701 to Hsu et al and 5,037,772 to McDonald teach methods of fabricating polysilicon to polysilicon or polycide to polysilicon capacitors. U.S. Pat. No. 4,697,330 to Paterson et al discloses a very high integrity capacitor dielectric in a polysilicon to polysilicon or polysilicon to metal capacitor.

SUMMARY OF THE INVENTION

Accordingly, it is a primary object of the invention to provide an effective and very manufacturable process for producing a metal-insulator-metal capacitor.

Another object of the present invention is to provide a method for fabricating a metal-insulator-metal capacitor having no metal residue on the sidewalls of the bottom plate electrode.

A further object is to provide a method for fabricating a metal-insulator-metal capacitor where the method is transparent to the CMOS technology.

A still further object is to provide a method for fabricating a metal-insulator-metal capacitor with an improved capacitor insulator layer.

Yet another object of the invention is to provide a method for fabricating a metal-insulator-metal capacitor with an improved oxide capacitor insulator layer.

Yet another object is to provide a method for fabricating a metal-insulator-metal capacitor having low resistivity.

In accordance with the objects of this invention, a method for fabricating an improved metal-insulator-metal capacitor is achieved. An insulating layer is provided overlying conducting lines on a semiconductor substrate. Via openings through the insulating layer to the conducting lines are filled with metal plugs. A first metal layer is deposited overlying the insulating layer and the metal plugs. A capacitor dielectric layer is deposited overlying the first metal layer wherein the capacitor dielectric layer is deposited as a dual layer, each layer deposited within a separate chamber whereby pinholes are eliminated. A second metal layer and a barrier metal layer are deposited overlying the capacitor dielectric layer. The second metal layer and the barrier metal layer are patterned to form a top plate electrode. Thereafter, the capacitor dielectric layer and the first metal layer are patterned to form a bottom plate electrode completing fabrication of a metal-insulator-metal capacitor.

BRIEF DESCRIPTION OF THE DRAWINGS

In the following drawings forming a material part of this description, there is shown.

DESCRIPTION OF THE PREFERRED EMBODIMENTS

Figure 1:
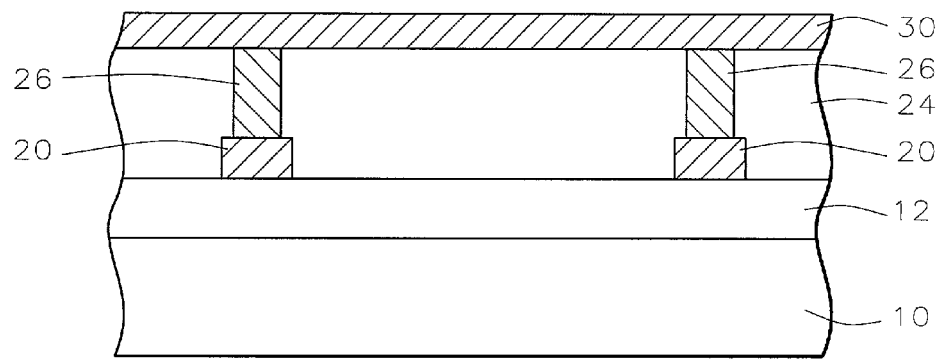
FIGS. 1 through 6 are schematic cross-sectional representations of a preferred embodiment of the present invention.

Referring now more particularly to FIG. 1, there is shown a partially completed integrated circuit device. The semiconductor substrate 10 is preferably composed of silicon having a (100) crystallographic orientation. Semiconductor device structures are formed in and on the semiconductor substrate. These may include gate electrodes and interconnection lines and associated source and drain regions and lower level metal lines. The semiconductor device structures, not shown, may be formed in layer 12 and covered with an insulating layer.

Next, metal lines 20 are formed as is conventional in the art. A thick insulating layer, such as chemically vapor deposited (CVD) silicon dioxide, phosphosilicate glass (PSG), high density plasma oxide, or the like, 24 is deposited over the lines 20 and then planarized, for example by chemical mechanical polishing (CMP), to obtain a flat surface.

Using conventional lithographic and etching techniques, via or contact openings are made through the insulating layer 24 to the metal lines 20. The contact/via openings are filled with a metal layer, such as tungsten, which is planarized by CMP or etchback to leave tungsten plugs 26.

Now, a metal layer 30 is deposited over the surface of the insulating layer 24 and the tungsten plugs 26. This metal layer will form the bottom plate of the capacitor. The metal layer 30 may comprise a first layer of titanium nitride, 250 to 400 Angstroms thick, a second layer of aluminum or an aluminum alloy such as AlCu, 3500 to 4500 Angstroms thick, and a third layer of titanium nitride, 700 to 1000 Angstroms thick. Alternatively, these layers may comprise tantalum nitride/copper/tantalum nitride, for example.

Figure 2:
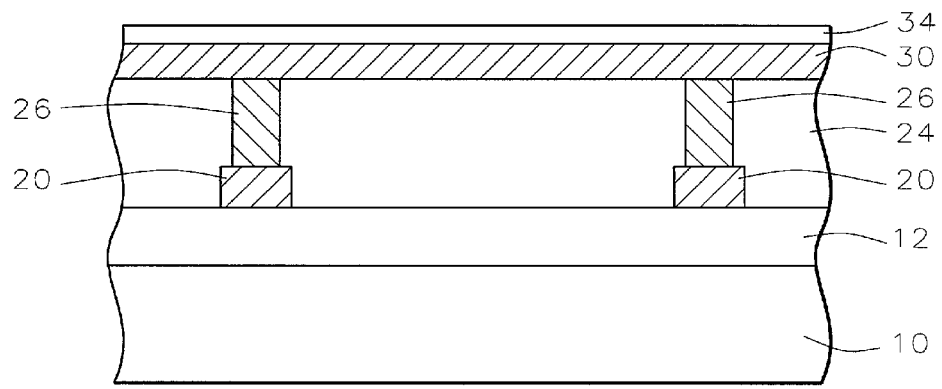

Referring now to FIG. 2, the capacitor dielectric layer of the invention is deposited. The key capacitor dielectric layer of the present invention is a dual deposition in two chambers of a cluster tool in order to overcome the problem of pinholes in the dielectric layer. The dielectric layer comprises two layers of silicon oxide deposited by plasma-enhanced chemical vapor deposition (PECVD), each layer having a thickness of between about 160 and 180 Angstroms. The layers are deposited at a temperature of between about 380 and 410° C. Pinholes are a localized thinning of the dielectric layer which are randomly distributed in the layer. By depositing two (or more) layers, the chance of the localized thinning happening at the same spot in all layers is reduced greatly. The gradual deposition of multiple layers to form the dielectric layer also reduces film stress, thereby stabilizing the interconnect scheme.

Both dielectric layers may comprise the same material, or they may be of different materials. For example, oxide/nitride or oxide/nitride/oxide may be used. $Ta_2O_5$ may also be used as the dielectric material, or $Ta_2O_5$/oxide, oxide/Ta2O5/oxide, and so on. The silicon oxide may be a very low deposition rate plasma-enhanced oxide that is silicon-rich to a small degree.

Optionally, the capacitor dielectric layer 34 is then alloyed in a low temperature furnace at between about 380 to 410° C. in a reduction atmosphere, such as an atmosphere of $H_2$ and $N_2$, preferably 10% $H_2$ and 90% $N_2$. This heat treatment improves the quality of the dielectric layer by densification. A good quality capacitor dielectric is obtained even without the densification step.

Figure 3:
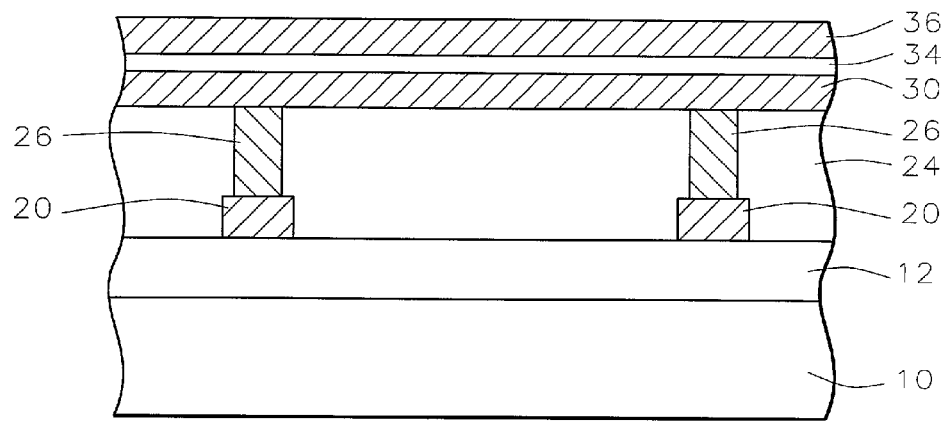

Now, referring to FIG. 3, the top metal plate layer is deposited. This layer 36 comprises a first layer of an aluminum alloy, such as AlCu, and a second layer of titanium nitride. Each of the two layers has a thickness of between about 800 and 1000 Angstroms. The presence of the AlCu in the top plate metal layer reduces parasitic resistance when compared to a top plate comprising only TiN. Other materials are possible in the process of the present invention. For example, the metal layer 36 may comprises TaN/Cu/TaN, TaN/Cu, or pure AlCu or pure Cu.

This top plate metal layer is very thin, having a combined thickness of between about 1600 and 2000 Angstroms and has a low resistivity of less than about 400 milliohms per square. Because of this low resistivity, the process of the invention can be used in radio frequency (RF) applications. Normally, the thicker the metal layer, the lower the sheet resistance. However, using AlCu instead of only TiN results in the lower resistivity. AlCu has a resistivity of about 3 milliohms per square while TiN has a resistivity of 20-60 milliohms per square. A thick metal layer is not desired because the high topography for opening a via plug for both top and bottom plates would be undesirable.

Figure 4:
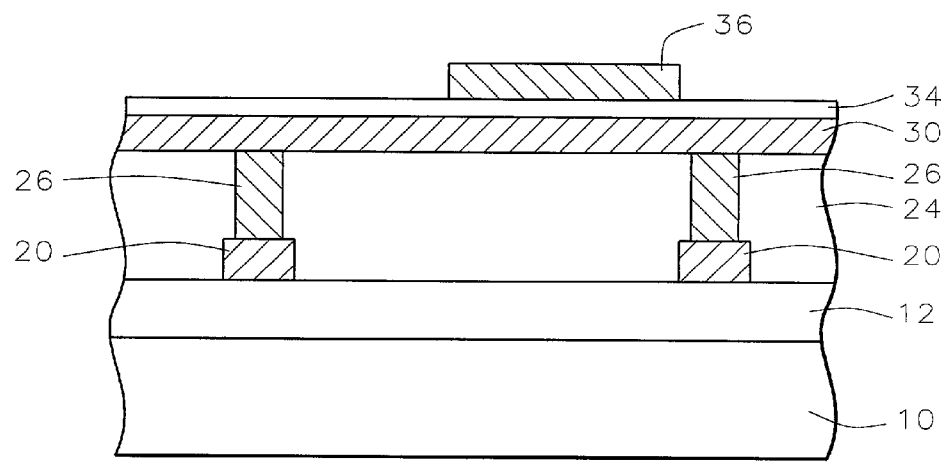
Figure 5:
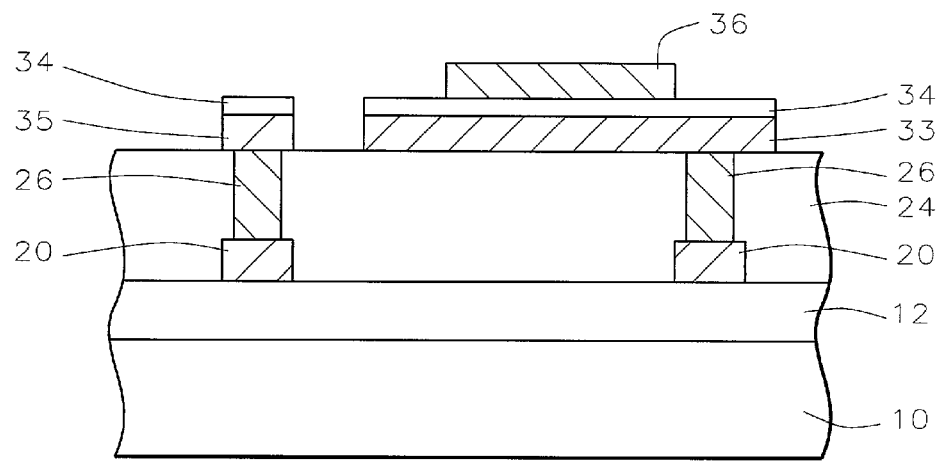

A photoresist mask, not shown, is formed over the substrate to define the capacitor top plate. The metal layer 36 is etched to form the capacitor top plate, as shown in FIG. 4. Referring now to FIG. 5, a second photoresist mask, not shown, is applied to form the bottom plate and interconnections. The capacitor dielectric and bottom plate metal layers 34 and 30, respectively, are etched to form the bottom plate electrode 33 and interconnect 35.

Since the bottom plate metal is patterned after the top plate metal is patterned, there will be no top plate metal residue on the sidewalls of the bottom plate. Since the capacitor process module is processed after the MOS devices are formed, there are no further high temperature processes to adversely affect the MOS devices.

Figure 6:
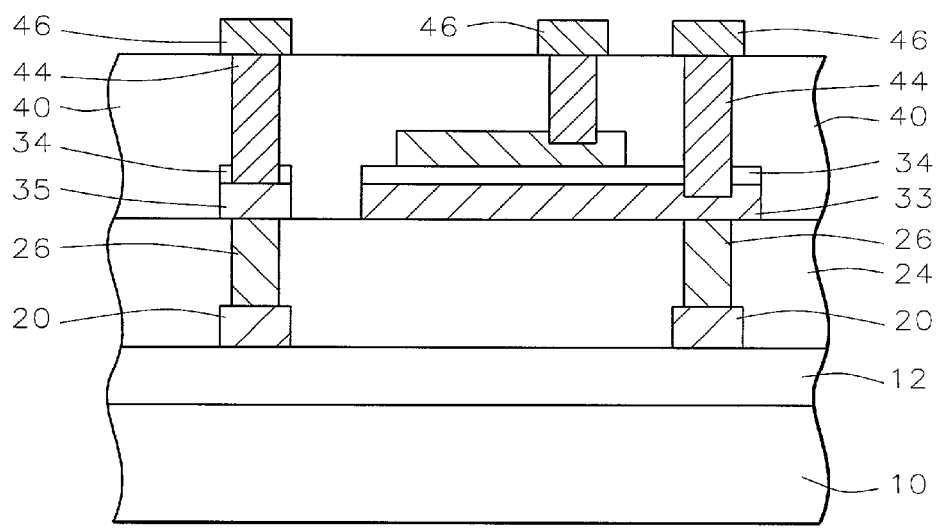

This completes the metal-insulator-metal capacitor 33/34/36 of the present invention. Processing continues as is conventional in the art and as illustrated in FIG. 6 to form another intermetal dielectric layer (IMD) 40 over the capacitor structure. Optionally, a silicon oxynitride layer may be deposited overlying the top and bottom plates before deposition of the IMD layer 40. This SiON layer will improve etch selectivity in forming the via openings. Vias are etched through the IMD layer to the metal layers to be contacted. The vias are filled with a metal layer 44, such as tungsten, which is planarized by CMP or etchback. The next level metal layer 46, such as aluminum or an aluminum alloy, is deposited and patterned, to form the next interconnection layer.

Figure 7:
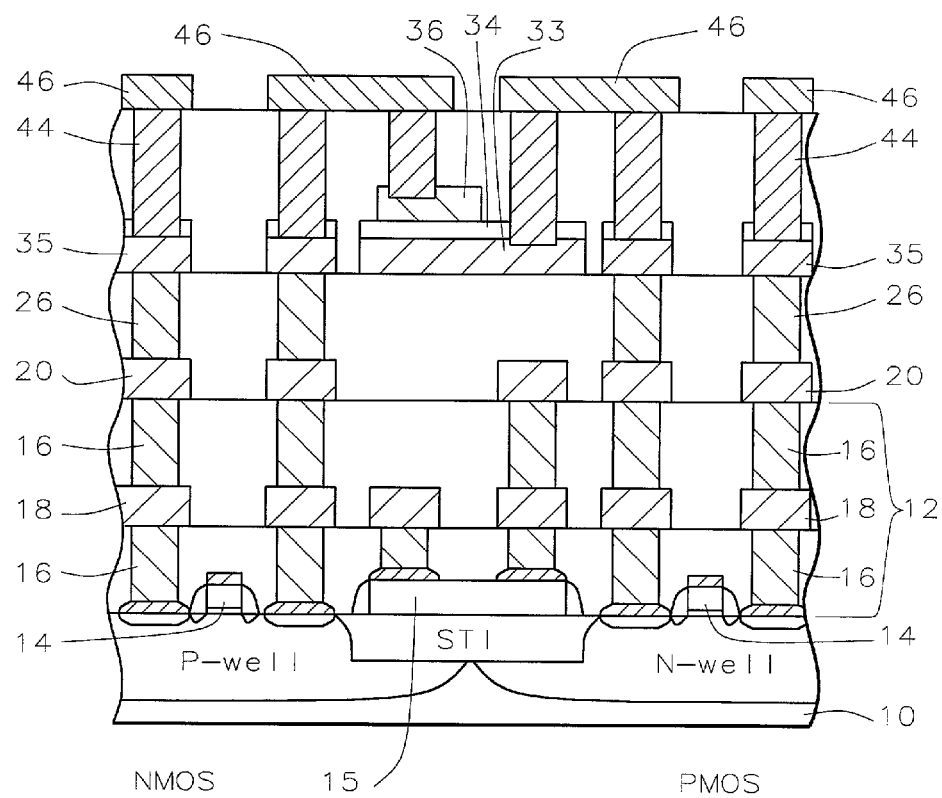
FIG. 7 is a schematic cross-sectional representation of a completed integrated circuit device fabricated according to the process of the present invention.

FIG. 7 illustrates an example of the use of the capacitor module process of the present invention in a mixed signal/RF CMOS process. Semiconductor device structures within layer 12 of FIGS. 1-6 have been shown in FIG. 7. For example, gate electrodes 14 and associated source and drain regions have been formed and silicided in the NMOS and PMOS areas. Resistor 15 has been fabricated over a shallow trench isolation (STI) region. A series of interconnections comprising, for example, tungsten plugs 16, and metal interconnects 18 and 20 are formed through intermetal dielectric layers. The metal-insulator-metal capacitor 33/34/36 of the invention is shown along with interconnects 44 and 46.

The process of the present invention provides an effective and very manufacturable process for fabricating an improved metal-insulator-metal capacitor. Many advantages can be seen, including a lower voltage coefficient, high quality capacitor dielectric, no metal residue, and ease of implementation. The metal to metal capacitor provides a lower voltage coefficient than hat for a PIP capacitor. The voltage coefficient measures the capacitance changed with applied voltage. The less change, the better the analog resolution. Normally, the voltage coefficient of a PIP capacitor is about 100 ppm/v. The voltage coefficient for the MIM capacitor of the present invention can be less than about 30 ppm/v. The dual deposition of the invention results in a high quality capacitor dielectric. The process of the invention prevents metal residue from contaminating the sidewalls of the bottom plate electrode. The capacitor process module of the present invention is transparent to present and future CMOS technology.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a metal-insulator-metal capacitor comprising:
   providing an insulating layer overlying a conducting line on a semiconductor substrate;
   etching through said insulating layer to form contact/via openings to said conducting line;
   filling said contact/via openings with metal plugs;
   depositing a first metal layer overlying said insulating layer and said metal plugs;
   depositing a capacitor dielectric layer overlying said first metal layer wherein said capacitor dielectric layer is deposited as a dual layer, each layer deposited within a separate chamber whereby pinholes within said capacitor dielectric layer are eliminated;
   depositing a second metal layer overlying said capacitor dielectric layer;
   patterning said second metal layer to form a top plate electrode; and
   thereafter patterning said capacitor dielectric layer and said first metal layer to form a bottom plate electrode completing said fabrication of said metal-insulator-metal capacitor.

2. The method according to claim 1 wherein said semiconductor substrate includes semiconductor device structures such as gate electrodes and source and drain regions.

3. The method according to claim 1 wherein said semiconductor substrate includes semiconductor device structures such as gate electrodes and source and drain regions and multiple levels of metal interconnections.

4. The method according to claim 1 wherein one of said metal plugs comprises the node contact for said capacitor.

5. The method according to claim 1 wherein said conducting line comprises metal.

6. The method according to claim 1 wherein said metal plugs comprise tungsten.

7. The method according to claim 1 wherein said first metal layer comprises:
a first layer of titanium nitride having a thickness of between about 250 and 400 Angstroms;
a second layer of AlCu having a thickness of between about 3500 and 4500 Angstroms; and
a third layer of titanium nitride having a thickness of between about 700 and 1000 Angstroms.

8. The method according to claim 1 wherein said first metal layer comprises:
a first layer of tantalum nitride having a thickness of between about 250 and 400 Angstroms;
a second layer of Cu having a thickness of between about 4000 and 6000 Angstroms; and
a third layer of tantalum nitride having a thickness of between about 700 and 1000 Angstroms.

9. The method according to claim 1 wherein said capacitor dielectric layer comprises a first layer of silicon oxide having a thickness of between about 160 and 200 Angstroms and a second layer of silicon oxide having a thickness of between about 160 and 200 Angstroms wherein said first and second silicon oxide layers are deposited by plasma-enhanced chemical vapor deposition.

10. The method according to claim 1 wherein said capacitor dielectric layer comprises layers of $Ta_2O_5$.

11. The method according to claim 1 wherein said capacitor dielectric layer comprises layers of $Ta_2O_5$ and silicon oxide.

12. The method according to claim 1 wherein said capacitor dielectric layer comprises layers of silicon oxide and silicon nitride.

13. The method according to claim 1 further comprising heat treating said capacitor dielectric layer before said step of depositing said second metal layer wherein said heat treating comprises heating said capacitor dielectric layer in a furnace at a temperature of between about 380 and 410° C. in a reduction atmosphere whereby said capacitor dielectric layer is densified.

14. The method according to claim 1 wherein said second metal layer comprises titanium nitride having a thickness of between about 800 and 1000 Angstroms overlying a layer of AlCu having a thickness of between about 800 and 1000 Angstroms.

15. The method according to claim 1 wherein said second metal layer comprises tantalum nitride having a thickness of between about 800 and 1000 Angstroms overlying a layer of Cu having a thickness of between about 800 and 1000 Angstroms.

16. The method according to claim 1 wherein said second metal layer comprises TaN/Cu/TaN having a combined thickness of between about 1600 and 2000 Angstroms.

17. The method according to claim 1 wherein said second metal layer comprises AlCu having a thickness of between about 1600 and 2000 Angstroms.

18. The method according to claim 1 wherein said second metal layer comprises Cu having a thickness of between about 1600 and 2000 Angstroms.

19. The method according to claim 1 wherein the resistivity of said top plate electrode is less than about 400 milliohms per square.

20. A method for fabricating a metal-insulator-metal (MIM) capacitor comprising:
providing an insulating layer overlying a conducting line on a semiconductor substrate;
etching through said insulating layer to form contact/via openings to said conducting line;
filling said contact/via openings with metal plugs wherein one of said metal plugs provides a node contact for said MIM capacitor;
depositing a first metal layer overlying said insulating layer and said metal plugs;
depositing a capacitor dielectric layer overlying said first metal layer wherein said capacitor dielectric layer is deposited as a dual layer, each layer deposited within a separate chamber whereby pinholes within said capacitor dielectric layer are eliminated;
heat treating said capacitor dielectric layer in a reduction atmosphere;
depositing a second metal layer overlying said capacitor dielectric layer;
patterning said second metal layer to form a top plate electrode; and
thereafter patterning said capacitor dielectric layer and said first metal layer to form a bottom plate electrode completing said fabrication of said metal-insulator-metal capacitor.

21. The method according to claim 20 wherein said semiconductor substrate includes semiconductor device structures such as gate electrodes and source and drain regions.

22. The method according to claim 20 wherein said semiconductor substrate includes semiconductor device structures such as gate electrodes and source and drain regions and multiple levels of metal interconnections.

23. The method according to claim 20 wherein said conducting line comprises metal.

24. The method according to claim 20 wherein said metal plugs comprise tungsten.

25. The method according to claim 20 wherein said first metal layer comprises:
a first layer of titanium nitride having a thickness of between about 250 and 400 Angstroms;
a second layer of AlCu having a thickness of between about 3500 and 4500 Angstroms; and
a third layer of titanium nitride having a thickness of between about 700 and 1000 Angstroms.

26. The method according to claim 20 wherein said first metal layer comprises:
a first layer of tantalum nitride having a thickness of between about 250 and 400 Angstroms;
a second layer of Cu having a thickness of between about 4000 and 6000 Angstroms; and
a third layer of tantalum nitride having a thickness of between about 700 and 1000 Angstroms.

27. The method according to claim 20 wherein said each layer of said capacitor dielectric layer has a thickness of between about 160 and 200 Angstroms.

28. The method according to claim 20 wherein said capacitor dielectric layer comprises silicon oxide deposited by plasma-enhanced chemical vapor deposition.

29. The method according to claim 20 wherein said capacitor dielectric layer comprises one or more of the following materials including: silicon oxide, silicon nitride, and $Ta_2O_5$.

30. The method according to claim 20 wherein said step of heat treating comprises heating said capacitor dielectric layer in a furnace at a temperature of between about 380 and 410° C. in a $H_2/N_2$ atmosphere whereby said capacitor dielectric layer is densified.

31. The method according to claim 20 wherein said second metal layer comprises one of the group containing: AlCu, Cu, AlCu/TiN, Cu/TaN, and TaN/Cu/TaN and has a thickness of between about 1600 and 2000 Angstroms.

32. The method according to claim 20 wherein the resistivity of said top plate electrode is less than about 400 milliohms per square.

33. A method for fabricating a metal-insulator-metal (MIM) capacitor comprising:
providing an insulating layer overlying a conducting line on a semiconductor substrate;
etching through said insulating layer to form contact/via openings to said conducting line;
filling said contact/via openings with tungsten plugs wherein one of said tungsten plugs provides a node contact for said MIM capacitor;
depositing a first metal layer overlying said insulating layer and said tungsten plugs;
depositing a capacitor dielectric layer overlying said first metal layer wherein said capacitor dielectric layer is deposited as a multiple layer, each layer deposited within a separate chamber whereby pinholes within said capacitor dielectric layer are eliminated;
heat treating said capacitor dielectric layer at a temperature of between about 380 and 410° C. in a reduction atmosphere to densify said capacitor dielectric layer;
depositing a second metal layer overlying said capacitor dielectric layer wherein said second metal layer has a thickness of between about 1600 and 2000 Angstroms;
patterning said second metal layer to form a top plate electrode; and
thereafter patterning said capacitor dielectric layer and said first metal layer to form a bottom plate electrode completing said fabrication of said metal-insulator-metal capacitor.

34. The method according to claim 33 wherein said semiconductor substrate includes semiconductor device structures such as gate electrodes and source and drain regions.

35. The method according to claim 33 wherein said semiconductor substrate includes semiconductor device structures such as gate electrodes and source and drain regions and multiple levels of metal interconnections.

36. The method according to claim 33 wherein said first metal layer comprises:
a first layer of titanium nitride having a thickness of between about 250 and 400 Angstroms;
a second layer of AlCu having a thickness of between about 3500 and 4500 Angstroms; and
a third layer of titanium nitride having a thickness of between about 700 and 1000 Angstroms.

37. The method according to claim 33 wherein said first metal layer comprises:
a first layer of tantalum nitride having a thickness of between about 250 and 400 Angstroms;
a second layer of Cu having a thickness of between about 4000 and 6000 Angstroms; and
a third layer of tantalum nitride having a thickness of between about 700 and 1000 Angstroms.

38. The method according to claim 33 wherein said each layer of said capacitor dielectric layer has a thickness of between about 160 and 200 Angstroms.

39. The method according to claim 33 wherein said capacitor dielectric layer comprises silicon oxide deposited by plasma-enhanced chemical vapor deposition.

40. The method according to claim 33 wherein said capacitor dielectric layer comprises one or more of the following materials including: silicon oxide, silicon nitride, and $Ta_2O_5$.

41. The method according to claim 33 wherein said second metal layer comprises one of the group containing: AlCu, Cu, AlCu/TiN, Cu/TaN, and TaN/Cu/TaN.

42. The method according to claim 33 wherein the resistivity of said top plate electrode is less than about 400 milliohms per square.

* * * * *